United States Patent [19]

Lehrer

[11] Patent Number: 4,654,269
[45] Date of Patent: Mar. 31, 1987

[54] STRESS RELIEVED INTERMEDIATE INSULATING LAYER FOR MULTILAYER METALIZATION

[75] Inventor: William I. Lehrer, Los Altos, Calif.

[73] Assignee: Fairchild Camera & Instrument Corp., Cupertino, Calif.

[21] Appl. No.: 747,471

[22] Filed: Jun. 21, 1985

[51] Int. Cl.[4] .................. B65D 5/12; B32D 17/06
[52] U.S. Cl. ......................... 428/428; 427/34; 427/96; 427/99; 427/226; 427/240; 427/255; 427/269; 427/271; 427/379; 427/380; 427/404; 427/419.2; 427/419.3; 427/419.4; 427/419.6; 428/432; 428/901
[58] Field of Search ............... 427/96, 99, 240, 226, 427/379, 380, 419.2, 419.3, 419.4, 419.6, 279, 271, 269, 270, 404, 34, 255; 428/934, 704, 929, 703, 901, 689, 426, 428, 432

[56] References Cited

U.S. PATENT DOCUMENTS 3,475,210 10/1969 Lehrer .................................. 117/215
4,045,594 8/1977 Maddocks ............................. 427/96
4,417,914 11/1983 Lehrer .................................. 65/60.53
4,468,437 8/1984 Patten et al. ........................ 427/270
4,492,717 1/1985 Pliskin et al. ........................ 427/96
4,508,757 4/1985 Fabricius ............................. 427/96

OTHER PUBLICATIONS

VLSI Technology, edited by S. M. Sze, ISBN 0-0-7-062686-3 (1983) pp. 107, 109, 111–115.

Primary Examiner—Norman Morgenstern
Assistant Examiner—Janyce A. Bell
Attorney, Agent, or Firm—Carl Silverman; David Carroll; Ronald Fish

[57] ABSTRACT

There is disclosed herein a stress relieved intermediate insulating layer consisting of one or more layers of spun-on glass lying over a metalization pattern. The spun-on layers are allowed to crack from thermal stress imposed upon the structure. The cracks in the spun-on layers are then filled with a glass layer deposited by CVD or LPCVD.

44 Claims, 5 Drawing Figures

STRESS RELIEVED INTERMEDIATE INSULATING LAYER FOR MULTILAYER METALIZATION

BACKGROUND OF THE INVENTION

This invention relates to the field of semiconductor processes that are compatible with scaling down of devices to smaller sizes and increasing the complexity of the metal and polysilicon interconnect patterns coupling various devices on the die to each other. More particularly, the invention relates to a process for creating a planarized layer of germanosilicate glass between aluminum and other types of metal interconnect layers, including polysilicon.

One of the major problems in semiconductor device fabrication is to make devices ever more complex without increasing the size of the die. Increased die size decreases yield and increases cost. However, to increase complexity on an integrated circuit die requires that thousands of transistors be interconnected into very complex circuit patterns. The interconnection patterns that result are very complicated and involve many crossing conductors.

In integrated circuit fabrication, conductors are usually formed in polysilicon or metals like aluminum, titanium or tungsten by photolithographic processes. This involves projecting light patterns onto a two dimensional plane to form a two dimensional pattern in the conductor after performing certain etching steps that are well known. There is no problem with a two dimensional interconnection pattern as long as one desires that at every place that two conductors cross that there be a circuit connection. However, where two conductors which cross each other are not supposed to be in electrical contact, there is a problem in making a crossover or crossunder such that the two conductors do not make electrical contact with each other. These problems grow in number as device complexity increases. One way of alleviating this problem is to add a second layer of conductor over the first conductor layer and separate the two by an insulating layer. Interconnections to selected conductors on the underlying layer can then be made through vias etched through the intermediate insulating layer. This process of adding conductive layers can be repeated as many times as necessary.

However these intermediate layers of insulating material must be flat and of high integrity to be effective because of the inherent characteristics of photolithography. The insulating layer must be of high integrity, i.e., no pinholes or cracks, so as to prevent shorts between layers or open circuits in the layers above it caused by failure of the layers deposited above to fill in the cracks in the insulator. The insulator must be flat to have good photolithography characteristics. Major problems are created in forming subsequent layers using photolithography when trying to project very fine and closely spaced patterns of light onto a non-flat surface. Such problems include depth of field difficulties and other well known problems.

Further, the intermediate insulating layer must be thermally stable such that when the device undergoes temperature cycling caused by dissipated heat or environmental conditions, the insulating layer will not crack. Such cracking usually results because of mismatched thermal expansion coefficients between the insulating material and the underlying conductive layer. This happens most often when the underlying interconnect layer is fabricated from metals such as aluminum.

In the prior art, attempts have been made to deposit silicon dioxide and germanosilicate binary glasses (PVX II) over aluminum interconnect layers. This creates several problems. First, there is the problem of thermal cracking caused by the difference of thermal expansion coefficient between the metal and the overlying glass. Second, microcracks or crevices caused by the inherent nature of the CVD process under certain conditions occur in the insulating layer at the intersection of the metal steps of the interconnect lines and the flat regions around them. Such microcracks are illustrated at 26 and 24 in FIG. 1 which illustrates the difference between the surfaces created by CVD deposited glass and spun on glass.

The thermal cracking is caused by stress in the overlying glass film. Stress in films deposited on wafers is a function of the degree of mismatch in the coefficient of thermal expansion and the thickness of the film. Higher degrees of mismatch cause more stress as do thicker films. As between aluminum and silicate dielectrics the degree of mismatch of coefficients of thermal expansion is as a number between 21 and 25 is to 1. Various modifiers can be added to the solution, but useful thicknesses have not been achieved to date because of the cracking problem.

The microcracking is an inherent limitation of step coverage with CVD films. Many chemical vapor deposition processes create bulges at sharp corners under certain reaction conditions. For example, FIG. 1 shows a metal step 10 on a substrate 12. A film 14 of silicon dioxide has been deposited by chemical vapor deposition. The line 15 shown in phantom represents the surface of a layer of spun on glass, and illustrates the differences in planarization which results from the two different processes of depositing insulating material. For chemical vapor deposition processes, the sharp points 16 and 18 of the metal step 10 cause increased chemical activity in these regions, which results in the bulges 20 and 22 being formed in the film 14 near the corners 16 and 18. Immediatly below these bulges, microcracks 24 and 26 form. These cracks are extremely difficult to cover completely with metal, and can lead to open circuits. The bulge formation process is intrinsic to the chemical vapor deposition process under certain conditions. Further, the creates a non-flat surface upon which to do photolithography. Non-flat surfaces make the projection of light to define images in photoresist of closely spaced conductors or other features on subsequent layers difficult or impossible. Further, non-flat surfaces such as that presented by the top surface of the oxide layer 14 with microcracks make it extremely difficult to deposit uniform films of metal with high integrity, i.e., no cracks or crevices in the metal film which can lead to open circuits in conductors which are supposed to be continuous.

In contrast, notice the relatively smooth geometry of the top surface 15 of the spun on glass. This gently rolling surface makes it simple to deposit high integrity metal films from which interconnection wires can be formed with no fear of open circuits in wires which were supposed to be continuous. Likewise, if another layer of spun on glass is added, the resulting surface is flat or almost flat, and photolithography to form very fine features which are closely spaced becomes possible.

Chemical vapor deposition processes are also high temperature processes generally with typical reaction temperatures for formation of silicon dioxide films ranging from 400 to 900 degrees centigrade depending upon the gases and chemical reactions used to form the film. These high temperatures preclude use of these processes over some structures which could be damaged by these high temperatures. Further, many of the gases used in the chemical vapor deposition processes are toxic, flammable or corrosive or all three.

Finally, uniformity of film coverage and flatness is generally not consistent in chemical vapor deposition processes.

It is known that the CVD process can be avoided by using a spin method to spin on coatings of silicon dioxide. In these methods, a solution of tetraethoxysilane (hereafter TEOS) can be spun onto a silicon wafer, heated appropriately and a glassy film will be formed. This process has advantages and eliminates some of the disadvantages of CVD and LPCVD processes, but leaves a major disadvantage. The major problem with this technique is that above a thickness range of approximately 3000 angstroms, the film develops cracks. These cracks are totally unacceptable since they decrease yield and render the devices unreliable.

Therefore a need has arisen for a structure and method of depositing a useable thickness of insulator film over first layer metal that does not crack under thermal stress regardless of how thick it is put on. Further, this film has to be flat and have high electrical integrity such that another layer of metal interconnects can be photolithographically defined over it. Further, the new method must be cheap and fast to use and not involve techniques which are too difficult to use in production.

SUMMARY OF THE INVENTION

Fundamentally, the invention is to spin on a layer or layers of glass, preferably, undoped silicon dioxide or an undoped binary germanosilicate glass of sufficient thickness and number of layers to create a flat insulating layer over the metal interconnect topology. The spun on glass is then subjected to sufficient thermal cycling to cause it to crack because of the difference between the thermal expansion coefficient of the underlying metal compared to the glass layer. A layer of insulator, preferably the same insulator as used on the first layer, is then deposited by chemical vapor deposition over the first layer. This second layer, fills in the cracks in the first layer, and it mirrors the flatness of the first layer or layers.

The advantages of this method are that the composite layer is already stress relieved such that there need be no concern that the layers so deposited will crack later in subsequent high temperature processing steps or during thermal cycling in operation. Further, there need be no concern regarding thermal cracking as between the spun on layer and the CVD layer if these two layers have the same or reasonably close coefficients of thermal expansion. The degree of match necessary to insure no cracking depends upon the relative thicknesses of the two layers. In the preferred embodiment, the two layers are the same material and have identical coefficients of thermal expansion.

Another advantage of the invention is that a very flat and smooth insulating surface may be formed over the first layer metal which far surpasses the smoothness, flatness and uniformity of film thickness which can be achieved using CVD deposited layers of insulator. The flatness and smoothness is provided by the spun on layer of glass whereas the CVD layer provides the bulk thickness and film integrity needed for good intermetal insulating films. By virtue of the fact that the second insulating film can be any of the CVD insulating films, particular etching needs of an application can be filled by tailoring the particular films which are spun on and deposited by CVD.

Because there is no need to reflow the composite insulator film to achieve flatness, there is no need to dope the glass films with phosphorus to lower the melting temperatures to a temperature which will not melt the underlying metals. This elimination of phosphorous dopant also eliminates the corrosion problems and other contamination problems associated with use of doped glass for an insulator. A major problem with phosphorous doped glasses as insulators is that phosphorous is an impurity which can convert a semiconductor to a conductor. If a doped glass lies over undoped silicon and a later high temperature step causes, some of the phosphorous to outdiffuse into an are of silicon which is supposed to remain undoped, the electrical characteristics of the device can be changed.

Finally, since no exotic materials or procedures are necessary to practice the invention, it is very manufacturable and should not adversely affect yield.

DETAILED DESCRIPTION OF THE PREFERRED EMBODIMENT

Figure 1:
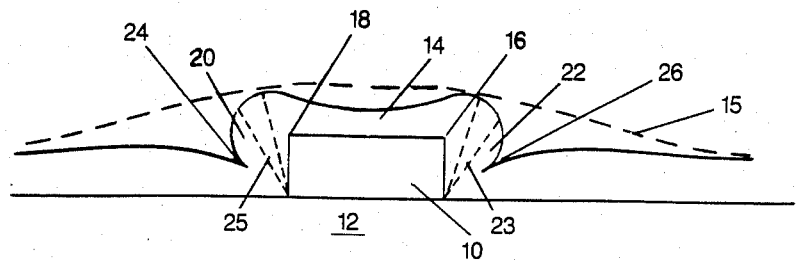
FIG. 1 is a cross sectional view of a metal step on an integrated circuit covered by a layer of CVD oxide and a layer of spun on glass.

When silicate glass insulating materials are deposited over metal steps such as the step 10 in FIG. 1, cracks will form at the edges of the metal steps during later high temperature steps in the process. The position of these cracks is illustrated at 23 and 25 in FIG. 1. The formation of these cracks and their positions are independent of the particular type of silicate glass insulator which is deposited over the metal step, and is independent of the method of deposition of the silicate glass insulating film. It is simply a function of the film thickness of the silicate glass insulator film and the mismatch of thermal expansion coefficients between the insulator and the metal step. The invention is to let the cracks form and then to fill them in with another insulating layer deposited on top of the first insulating layer.

Figure 2:
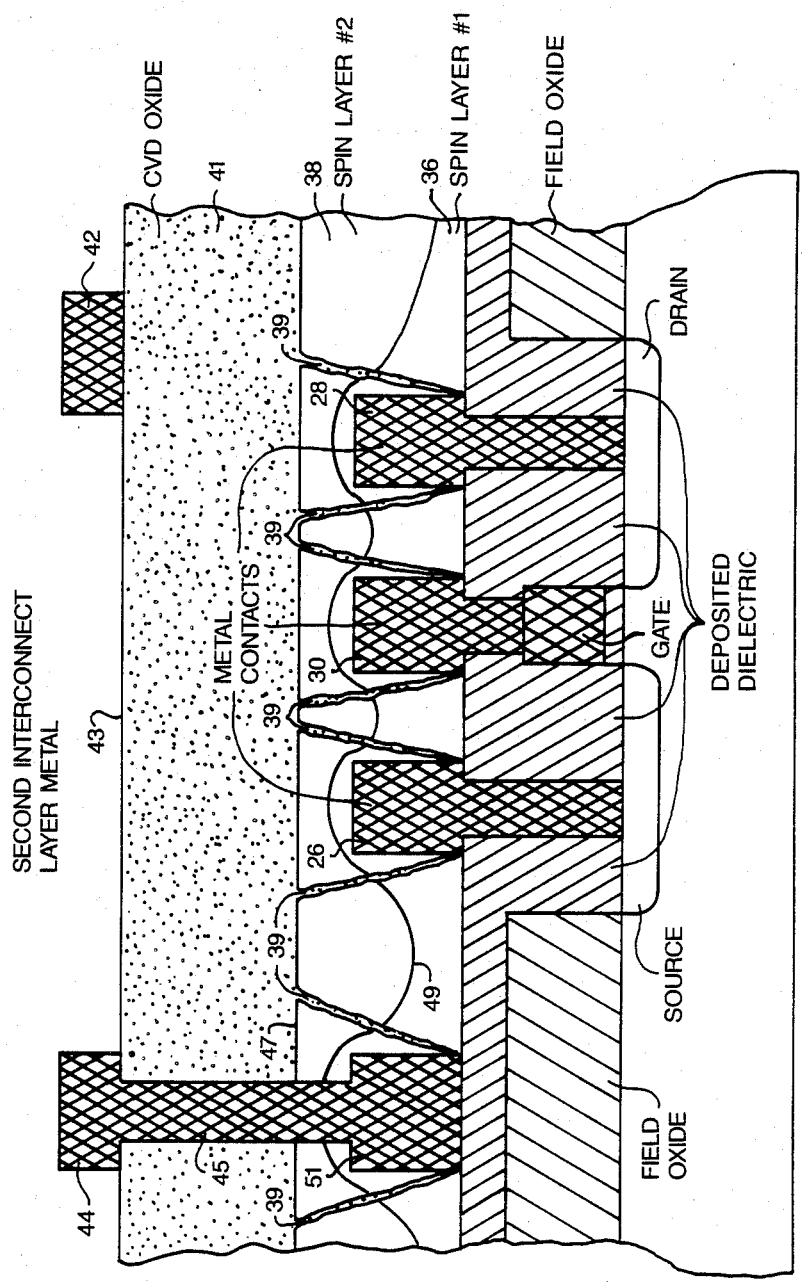
FIG. 2 illustrates the structure of the insulation layer formed by practicing the invention.

FIG. 2 illustrates the structure of the insulation layer formed by practicing the invention. FIG. 2 illustrates an MOS transistor with metal source, drain and gate contacts 26, 28 and 30 respectively. It is to be understood however, that the invention is not limited to MOS transistors or any particular integrated circuit structure. The invention has utility wherever several layers of metalization must be formed by photolithography and separated by a high integrity insulating layer. The typical situation wherein the invention would be used would be to add another layer of interconnects above the metal contact layer of which contacts 26, 28 and 30 are a part. To do this, a flat, high integrity, stress relieved layer of insulator material must be formed over the first layer interconnect metal.

The insulating layer of the invention is comprised of the following: a first spun on insulating layer 36 used to soften the edges of the topography; a second spun on insulating layer 38 to flatten the topography; thermally formed cracks 39 to provide stress relief; and a third layer of insulator 41, preferably of the same chemical composition as the spun on layers, to fill in the cracks 39 and provide electrical integrity thereby preventing shorts and opens in the circuitry. Second layer interconnect metal lines 42 and 44 are then formed on the flat surface 43 on the top of the third insulating layer 41. A via 45, etched through the first, second and third insulating layers, provides a pathway for metal to form an electrical interconnection between the first and second interconnect layers.

It is to be understood that the addition of the second spin on layer 38 is optional and is preferred only because it provides more flatness than a single spun on layer would provide. Ideally the surface 43 of the third insulating layer should be perfectly flat. However, the third insulating layer is preferably CVD oxide and will mirror the topography of the spin on layer beneath it.

Therefore, it is desirable to have a very flat surface 47 upon which to deposit the third insulating layer. As seen from the top surface of the first spin on layer 36, the top surface 49 undulates with the topography of the first interconnect layer. If the CVD oxide or third insulating layer 41 were deposited on top of the first spin on layer, the top surface 43 of the third insulating layer would undulate if it was deposited by CVD and would mirror the undulations of the surface 49. This could cause difficulties for the reasons discussed below.

The second layer of interconnect conductors will have to be formed photolithographically by etching a metal layer deposited on the surface 43 into the desired interconnect pattern. To do this photolithographic process properly for very small geometries and very close spacing between features, a flat surface 43 on top of the insulating layers 36, 38 and 41 must be formed.

The invention solves this flatness problem by eliminating the use of a CVD deposition for depositing the first layers of insulating material and substituting a spin on process for depositing the first and, optionally, the second insulating layers. This is done by spinning on a solution which is turned first into a gel polymer and later into a binary glass. The spin on process gives great flatness of the deposited films. This can be visualized by reference to FIG. 1 which shows the difference in flatness of the top surfaces of both a CVD oxide layer of glass and a spun on layer of glass. The top surface 15 of the spun on layer (shown in phantom) is much smoother and flatter than the top surface of the CVD layer 14. This flatness derives from the centrifugal force tending to pull of excess solution and evenly distribute the solution over the wafer surface. Any ripples which start to form in the surface have forces of surface tension, centrifugal force and adhesion to the surface which tend to smooth them out thereby preventing their formation and maintaining a smooth surface. The steps of this spin on process and the other steps of the method of the invention will be described with reference to FIG. 3.

Referring to FIG. 3(A) the first step in the process is to prepare the solution defined later herein in preparation for the dispense and spin steps. Then the wafer having the transistor structure of FIG. 2, or whatever other structure that is to be covered, is placed in a spinning device such as is conventionally used to spin on photoresist. Known processes are used to form the transistor structure of FIG. 2. Spinning devices are well known in the industry as they have been used for years to depsoit photoresist films. The spinning process for photoresist is also well known, and is described in detail in *Integrated Circuit Fabrication Technology*, by David Elliot, (1982 McGraw Hill Book Company), Library of Congress Number TK7874.E49, ISBN 0-07-019238-3 at Chapter 6. This book is hereby incorporated by reference.

Figure 4:
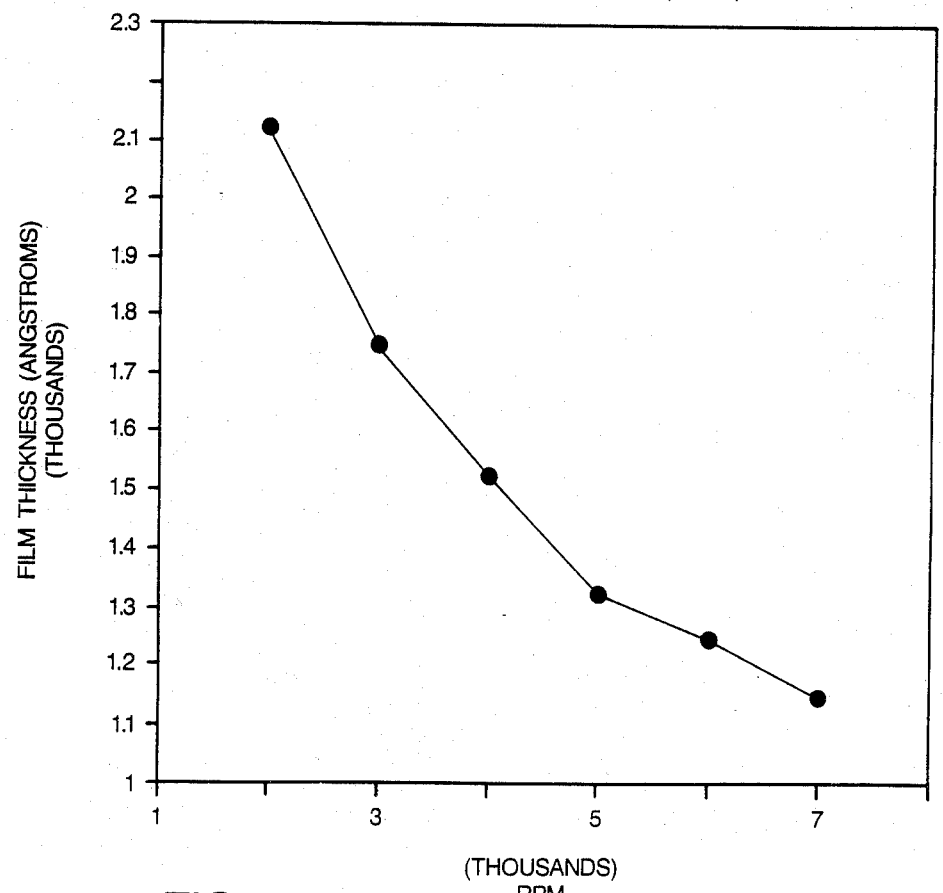
FIG. 4 is a spin speed vs. film thickness characteristic curve for a 20% TEOS solution.
Figure 5:
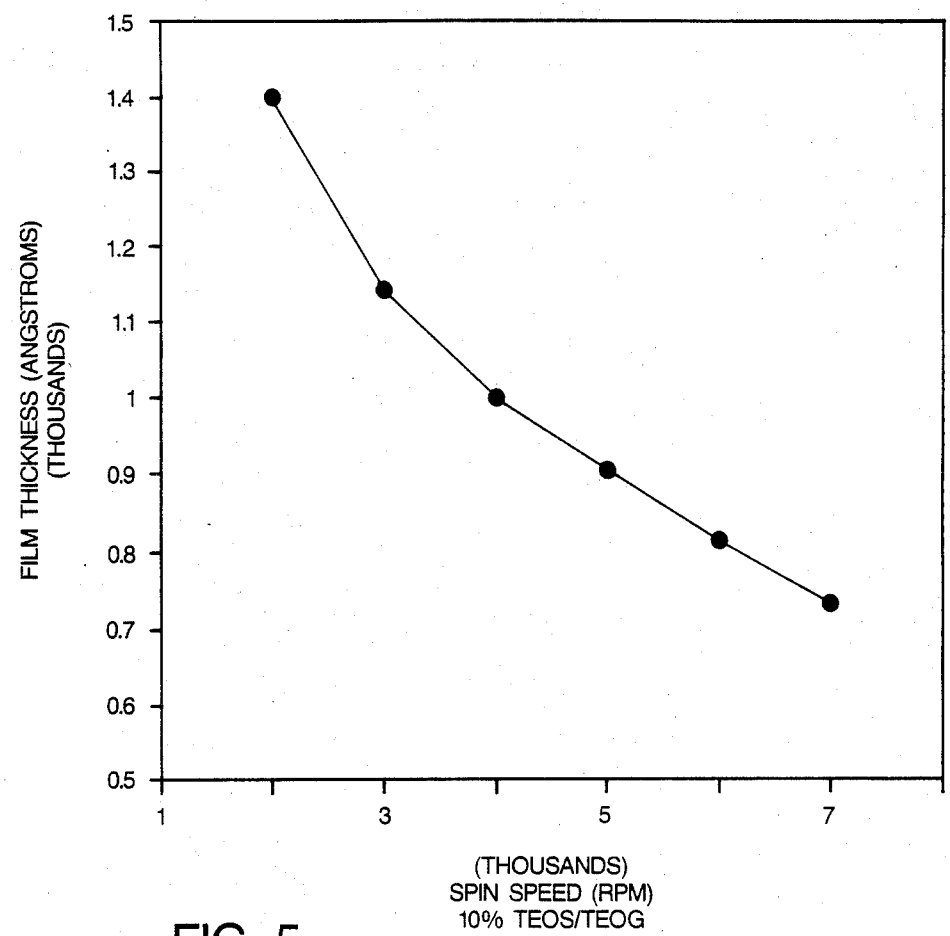
FIG. 5 is a spin speed vs. film thickness characteristic curve for a 10% TEOS/TEOG solution.

A quantity of this solution is then placed on the wafer center and allowed to flow out to the edges of the wafer as indicated by FIG. 3(B). The wafer is then spun at the speed necessary to obtain the desired film thickness as indicated in FIG. 3(C). In the preferred embodiment, the desired film thickness for the first spun on layer 36 in FIG. 2 is 2000 angstroms, and the preferred thickness for the second spun on layer 38 is also 2000 angstroms. As indicated at page 128 of Elliot, the film thickness for a spun on film is proportional to the square of the solids content of the solution and inversely proportional to the square root of the spin RPM. However, that formula is for photoresist, and the glass forming solutions used in the invention are slightly different, although the relationship noted above is still generally true. The actual relationship between the spin speed and the resulting film thickness for the preferred solution to be described later herein is given by the curve of FIG. 4. The preferred solution is a 20% TEOS solution which has a solids content and viscosity which gives a film thickness of 2000 angstroms at an RPM of slightly under 2400 RPM. Of course the RPM selected will depend upon the underlying topography and the desired film thickness for the application intended. However, it is generally better to use a larger number of thin coats rather than a single thick coat when maximum flatness is desired. Since very precise control of the spin speed can be maintained, the film thickness can be controlled equally precisely. The curve of FIG. 5 is the film thickness versus spin RPM for the solution used in another embodiment of the invention. The curve of FIG. 5 is based upon a 10% TEOS/TEOG solution.

The next step in the process is to bake the solution to drive off the solvents so as form the silicon dioxide or the oxides in the binary glass depending upon the solution used as the starting material. Some of the solvents begin to leave the solution immediatly upon mixing and dispensing it onto the wafer. At some point prior to spinning the wafer the solution turns into a polymer in a reaction catalyzed by the presence of the acid. The formation of this polymer is essential to prevent the solution from completely flying off the wafer during the spinning step. Any catalyst or other process which forms this polymer and does not adversely affect formation of the oxides will suffice for purposes of practicing the invention.

In the preferred embodiment, the bake step represented by FIG. 3(D) is performed in two stages. However, it can also be done in a single stage by baking the wafer and remaining gel on the surface at a temperature and for a time sufficient to remove the solvents, form the oxides and densify the resulting glass. Although it might be possible in some embodiments to remove the solvents using evaporation or vacuum methods, it is preferred to use heat since this is simple and is necessary for the formation of the oxides. A bake step at at least 400 degrees centigrade for at least 30 minutes should be sufficient to accomplish all of the above functions.

In the two stage bake, the first stage is a low temperature bake at approximately 135 degrees centigrade for 5–10 minutes to drive off the solvents. The purpose of this bake is to drive off all the solvents. The second stage bake is preferably done at between 450 and 500 degrees centigrade for 15–30 minutes. The purpose of this bake is to convert the polymer gel into silicon dioxide glass or a binary glass comprised of germanium dioxide and silicon dioxide depending upon which solution was used as the starting material. Higher or lower temperatures can be used, but this will change the time for the reactions to take place. Higher temperatures yield a denser glass, i.e., the compaction of the glass improves which gives it greater structural integrity and higher resistance to the diffusion of unwanted impurities into the structures below. Greater density also changes the etch rate of the glass. Fundamentally, any temperature which will not damage the structure below the glass layer and which will form the oxides in a reasonable time can be used. Higher temperatures are generally better unless there are implanted regions or other impurity doped regions which might change dimension in an unwanted way during a high temperature densification step for the spun on glass.

Higher temperatures are not needed for flattening the glass structure by reflow however, since all flatness in the structure is derived through the spin on process alone. This is the reason no phosphorous dopant is used in the spun on glass. Phosphorous dopant was used in the CVD deposited P-glasses of the prior art to lower their melting temperatures. This was necessary so these glasses could be melted or reflowed to smooth the surface for easier photolithography and better metalization properties. But the presence of phosphorous dopants creates other processing problems such as corrosion and inadvertant doping of areas which are supposed to remain undoped. Elimination of phosphorous in the invention is a significant advantage.

Following formation of the spun glass layer or layers, stress relief must be done to prevent cracking in final insulating structure by precracking the sturcture and then repairing the cracks. The first step in this process is to stress the spun on glass layers to cause them to crack. This could be done mechanically, but thermal temperature cycling stress caused by differing amounts of thermal expansion in the different materials is preferred. Thermal stress is most likely to duplicate all cracking that might occur in later high temperature processing steps, whereas mechanical stress might not create the same cracks that would result from later high temperature processing steps. Preferably the type of thermal cycling used to cause the stress should meet or exceed the maximum thermal stress that the device could face in later high temperature processing steps or in temperature cycling that could result from operation in the field.

The next step is to deposit a third layer of insulating material over the spun on layers of glass. In the preferred embodiment, this third insulation layer is 8000 angstroms of CVD silicon dioxide, but the method of deposition, the material deposited on the film thickness are matters of design choice based upon the application. This third insulating layer could be deposited by any conventional means, but chemical vapor deposition is preferred since it is a known process and the reaction conditions can be varied to tailor the resulting film to the desired application. Plasma deposition is also a possibility for a deposition mechanism, but it is believed that CVD films do better at getting into and sealing the thermal cracks such as the cracks 39 in FIG. 2. It is very important that the deposited film completely seal all cracks in the spun on glass layers. It is also important that the reaction temperature used in the CVD or plasma deposition process not exceed the melting temperature of the underlying metal layer however. For aluminum which melts at approximately 540 degrees centrigrade, the decomposition of silane in oxygen at a temperature near 400 degrees centigrade is one possibility. This can be done at atmospheric temperature or at lower pressures to have the benefits of low pressure CVD processes such as more conformal coatings, higher throughput, precise control of composition and structure of the deposited film and low processing costs.

Other possible deposition processes are plasma deposition of silicon dioxide by reacting silane and nitrous oxide in a glow discharge at approximately 200 to 350 degrees centrigrade. It is also possible to use plasma deposition of silicon nitride by reacting silane with ammonia or nitrogen in a glow discharge between 200 and 350 degrees centrigrade. However, where the spun layer is silicon dioxide or a binary germanosilicate glass, it is preferable to deposit a third insulating layer having the same chemical composition, density and etching properties over the spun on layers. To do otherwise complicates the process of etching vias in the composite insulation layer.

For example, if two different materials are used for the individual layers, different etchant materials may be necessary. Further, even if a common etchant may be found, the two different materials may etch at different rates. This can cause the geometry of the vias to deviate from the design tolerances because of lateral etching in the top layer during slower etching in the bottom layer or layers. It is possible that this problem could be eliminated by putting the slowest etching layer on the top so that not much lateral etching occurs in the slow etching top layer during the time it takes to etch through the fast etching bottom layer. In some applications, the complications of etching different materials may not matter. Details of chemical vapor deposition and plasma deposition of dielectric films can be found in *VLSI Technology*, edited by S. M. Sze, (1983 McGraw Hill Book Company), Library of Congress Number TK7874.V566, ISBN 0-07-062686-3 and *Integrated Circuit Fabrication Technology*, by David Elliott, (1982 McGraw Hill Book Company), Library of Congress Number TK7874.E49, ISBN 0-07-019238-3 which are incorporated herein by reference.

Figure 3:
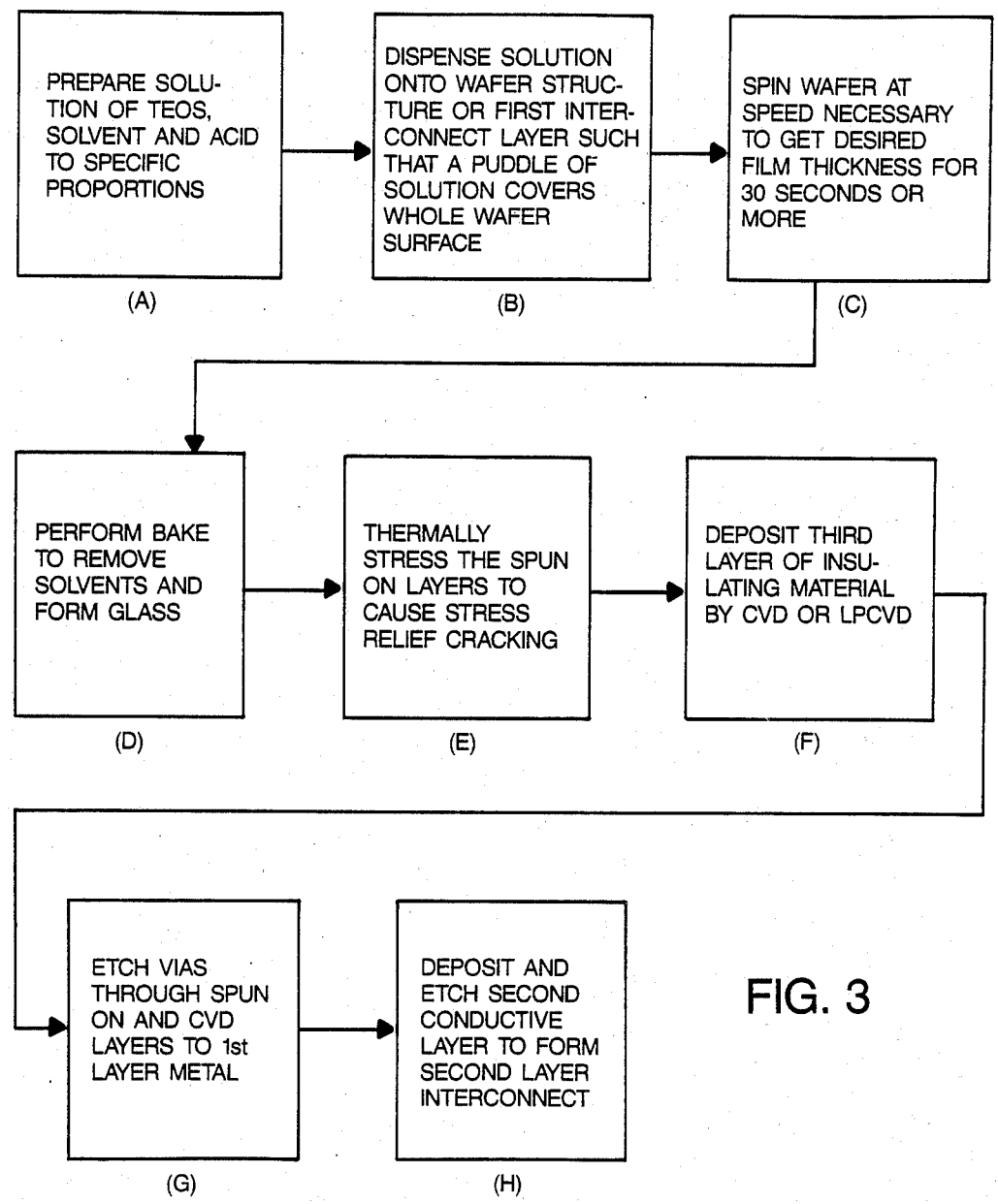
FIG. 3 is a flow diagram of the process of the invention.

The next step is to etch vias in the planarized composite insulating layer formed in steps (A)–(F) of FIG. 3. This can be done by any known process which can etch vias of the desired geometry in the chosen materials. This step is symbolized by FIG. 3(G). Such process are known, and are described in the references incorporated herein. The advantage of the planarization of the surface 43 in FIG. 2 is that photolithography to define the geometry and spacing of these vias can be precisely performed without suffering from depth of field problems which are normally encountered when projecting focused images onto a non-flat photoresist coated surface. Such problems are well known and result from the image being focused at certain areas which are at the focal length from the mask and not being focused in areas of the surface which are closer to or farther away from the lens. Typically, the resolution of a step and repeat projection system can be increased only at the expense of depth of focus. A stepper with a numerical aperture of 0.17 and an exposure wavelength of 4000 angstroms will have a resolution limit of about 1.2 micrometers and a depth of focus of approximately plus or minus 7 micrometers. Any topographical feature which extends out of this depth of field will have an unfocused image projected on it. Therefore, flatness is very important to making a technology scalable down to smaller feature sizes. This problem spoils the sharpness of the images which can be projected and limits the precision of the control of the geometry size that can be achieved and the precision of the control of spacing between features which can be reliably achieved. Forming a flat surface such as surface 43 in FIG. 2 upon which to deposit photoresist causes the photoresist to have a flat surface upon which a very sharp image of the desired vias can be focused. The spacing of these via images can be closer than in non-flat cases because the design rules can be made tighter.

The last step, as symbolized in FIG. 3(H) is to deposit a layer of conductive material from which to form the second layer of interconnects. The second layer interconnect pattern will preferably be formed out of a metal such as aluminum. The manner of depositing a metal layer and etching it into the conductive pattern symbolized by the conductors 42 and 44 in FIG. 2 is well known and there are many alternative ways described in the books incorporated by reference herein. The particular manner selected to form this second interconnect layer is not critical to the invention.

Referring again to FIG. 3(A), the particular solutions which can be used in the invention will be described. In a first embodiment, a solution of TEOS, TEOG, a solvent such as a lower alcohol or a ketone, and a compatible mineral or organic acid such as nitric acid or hydrochloric acid is preapred as the starter solution which will ultimately become the spun on glass layer. The solution composition is as follows:
*2.53-2.76 grams of tetraethoxygermane (TEOG);
*2.47-2.24 grams of tetraethoxysilane (TEOS) Si-(OC$_2$H$_5$)$_4$;
*40 grams of solvent such as a lower alcohol or ketone;
*0.3 grams compatible mineral or organic acid such as HNO$_3$;
*5 grams of water.
If 2.53 grams of TEOG and 2.47 grams of TEOS are used, the resultant binary glass is 45 mole percent germanium dioxide and 65 mole percent silicon dioxide. If 2.76 grams of TEOG and 2.24 grams of TEOS are used, the resultant binary glass will be 50—50 mole percent germanium dioxide-silicon dioxide. Other solutions of course yield differing binary glass compositions. The preferred composition in this particular embodiment is 2.76 grams TEOG and 2.23 grams TEOS with all other components being the same.

The solvent used is not critical to the invention, and any solvent that will dissolve TEOS and TEOG will be adequate. Examples of types of alcohols that will work are: ethyl, methyl, butyl, or propyl. Examples of ketones that will work are MEK and acetone. The factors which matter are the target mole percentage composition of the resultant binary glass and the film thickness thereof. The mole percent of the composition of the binary glass that results depends upon the relative amounts of TEOS and TEOG that were present in the original solution. Since any of these compounds that do not go into solution will not be in the final composition, the solvent selected should be such the solubility of TEOS and TEOG in it is such that the selected amount of each compound dissolves completely. If the solubility is otherwise, then the resultant binary glass will not have the mole percent composition intended for it.

Generally any of the lower alcohols and lower ketones and some combinations of the two will meet the above requirements. It is possible that other polar solvents will also meet these requirements so as to be functional equivalents. The preferred solvent is ethyl alcohol, but other solvents are cheaper.

The particular acid used is not critical to the invention as long as it is compatible with the other components of the solution. Generally any mineral acid with the exception of hydroflouric acid or any organic acid can be used. A sufficient amount of acid must be added to bring the pH of the solution to between 1.5 and 2.0.

The thickness of the layer to be formed in this spin on process is a matter of choice for the designer depending upon the application involved. The layer thickness can be controlled for any given solution solids content and viscosity by controlling the spin speed at which the layer is deposited per FIGS. 4 and 5.

The preferred solution for use in the invention is a 20% solution of tetraethoxysilane as follows:
20 grams tetraethoxysilane
60 grams isoproponal
20 grams water
0.6 grams nitric acid.

As noted above with respect to the TEOS/TEOG solution, the exact composition of the solvent system is not critical to the invention. Any solvent system, including the acid or other catalyst, which will give a 20% solution, cause the gel formation prior to the complete spinning off of all the solution and which will produce the desired oxide after baking will be adequate. The comments above about particular classes of solvents and acids which work are equally applicable here.

Although the invention has been described in terms of the preferred embodiment described herein, it will be apparent to those skilled in the art that various modifications can be made without departing from the spirit and scope of the invention. All such modifications are intended to be included within the scope of the claims appended hereto.

What is claimed is:

1. A method of providing a stress relieved dielectric layer over an integrated circuit comprising the steps of:
   mixing a solution comprised of oxide glass forming ingredients which can be spun onto a semiconductor wafer and which will cause a gel formation prior to completely being spun off the wafer when the wafer is spun and which can be heat treated to form an electrical insulating layer;
   depositing a predetermined amount of the solution on a wafer containing said integrated circuit;
   spinning said wafer;
   baking said wafer and said solution until, said an oxide glass electrical insulating layer is formed;
   heat treating said electrical insulating layer until it cracks; and
   depositing a second layer of insulator to fill in the cracks.

2. The method of claim 1 wherein said deposition step comprises depositing a predetermined amount of said solution over a first layer interconnect pattern of said wafer which is fabricated in metal.

3. A method of providing a stress-relieved dielectric layer over an integrated circuit comprising the steps of
   mixing a solution of solvents and oxide glass forming active ingredients;
   depositing a predetermined amount of the solution on a wafer containing said integrated circuit;
   spinning said wafer;
   baking said wafer and said solution until an oxide glass is formed;
   heat treating said oxide glass layer until it cracks; and
   depositing a second layer of insulator material to fill in the cracks
   wherein the step of mixing includes the steps of mixing sufficient quantities of tetraethoxysilane, a solvent that can dissolve tetraethoxysilane, water, and an acid such that the resultant solution is approximately 20% by weight tetraethoxysilane.

4. A method of providing a stress relieved dielectric layer over an integrated circuit comprising the steps of:
   mixing a solution of solvents and oxide glass forming active ingredients;
   depositing a predetermined amount of the solution on a wafer containing said integrated circuit;
   spinning said wafer;
   baking said wafer and said solution until an oxide glass is formed;
   heat treating said oxide layer until it cracks; and
   depositing a second layer of insulator to fill in the cracks
   wherein said step of mixing a solution includes the steps of mixing sufficient quantities of tetraethoxygermane and tetraethoxysilane with a solvent that can dissolve these two compounds and a compatible acid with sufficient water to result in an ultimate solution which is 10 to 20 percent by weight tetraethoxygermane and tetraethoxysilane.

5. The method of claim 1 wherein said step of spinning includes spinning said wafer at an RPM selected to result in a predetermined post bake film thickness for a given solution solids content and viscosity.

6. The method of claim 1 wherein said bake step to form the oxide comprises the steps of baking the wafer and solution at a minimum of 400 degrees centigrade for a sufficient time to drive out all the solvents and water and to form the oxides comprising the glass.

7. The method of claim 1 wherein said bake step to form the oxide comprises the steps of baking the wafer and solution at a temperature sufficient to drive out the water and solvents in a reasonable time and then baking the resulting structure at a temperature sufficient to create the oxides of the glass.

8. The method of claim 7 wherein said second bake step is done at a temperature sufficient to create a glass with a predetermined density.

9. The method of claim 7 wherein said first bake step is done at approximately 135 degrees centigrade for 5 to 10 minutes.

10. The method of claim 7 wherein said second bake step is done at approximately 450 to 500 degrees centigrade for 15 to 30 minutes.

11. The method of claim 7 wherein said second bake step is done at a temperature which is as high as possible without damaging the underlying structure.

12. The method of claim 1 wherein said spinning step includes spinning the wafer at between 2000 and 4000 RPM.

13. A method of providing a stress relieved dielectric layer over an integrated circuit comprising the steps of:
   mixing a solution of solvents and oxide glass forming active ingredients;
   depositing a predetermined amount of the solution on a wafer containing said integrated circuit;
   spinning said wafer;
   baking said wafer and said solution until an oxide glass is formed;
   heat treating said glass layer until it cracks; and
   depositing by chemical vapor deposition a second layer of silicon dioxide insulator to fill in the cracks
   wherein the solution mixing step includes the steps of mixing approximately 20 grams of tetraethoxysilane with approximately 60 grams of isopropanal alcohol and approximately 20 grams of water and approximately 0.6 grams of nitric acid.

14. A method of providing a stress relieved dielectric layer over an integrated circuit comprising the steps of:
   mixing a solution of solvents and oxide glass forming active ingredients;
   depositing a predetermined amount of the solution on a wafer containing said integrated circuit;
   spinning said wafer;
   baking said wafer and said solution until a glass is formed;
   heat treating said glass layer until it cracks; and
   depositing a second layer of silicon dioxide insulator to fill in the cracks
   wherein the solution mixing step includes the steps of mixing sufficient amounts of tetraethoxygermane, tetraethoxysilane, a solvent and water and a phosphoric acid such that the post bake, spun on glass layer is comprised of approximately 40 to 50 mole percent silicon dioxide, 55 to 40 mole percent germanium dioxide, and 1 to 5 mole percent $P_2O_5$.

15. The method of claim 1 wherein said step of depositing a second layer of insulator includes the step of depositing an insulator by chemical vapor deposition.

16. The method of claim 1 wherein said step of depositing a second layer of insulator includes depositing a layer of silicon dioxide.

17. The method of claim 16 wherein said depositing a second layer step includes depositing by chemical vapor deposition.

18. The method of claim 16 wherein said depositing a second layer step includes the step of decomposing silane and oxygen at approximately 400 degrees centigrade or less in a chemical vapor deposition step.

19. The method of claim 18 wherein the chemical vapor depostion is done at atmospheric pressure.

20. The method of claim 1 wherein said deposition step includes depositing the insulator by low temperature plasma deposition.

21. The method of claim 1 wherein said step of depositing a second layer of insulator includes the step of depositing an insulator that matches the chemical composition of the spun on layer of insulator.

22. A method of providing a stress relieved, smooth insulating layer on an integrated circuit comprising the steps of:
   mixing a solution of tetraethoxysilane, a solvent, water and a compatible acid such that a 20% TEOS solution is achieved with a pH between 1.5 and 2.0 is achieved;
   depositing a sufficient amount of the solution on a wafer containing the integrated circuit such that the entire wafer surface is covered;

removing a sufficient amount of the solvents to form a gel;

spinning the wafer at an RPM selected to achieve a post bake film thickness which is selected in accordance with the integrated circuit topography and the intended use of the film;

baking the wafer and the film until an insulating film is formed;

heat treating the wafer and film until it cracks;

depositing a second layer of insulator which fills in the cracks of the spun on film and which matches the chemical composition and etch rate of the spun on layer.

23. The method of claim 22 wherein the mixing step includes the step of mixing in a sufficient quantity of tetraethoxygermane and phosphoric acid such that the final composition of the spun on layer is 40 to 50 mole percent silicon dioxide, 55 to 40 mole percent germanium dioxide and 1 to 5 mole percent $P_2O_5$.

24. The method of claim 22 wherein said baking step includes the steps of baking the wafer and solution at a temperature of approximately 135 degrees centigrade for a sufficient time to drive off all the solvents, and then baking the wafer at a temperature of between 450 and 500 degrees centigrade for a sufficient time to create the oxides of the glass.

25. A stress relieved insulating structure on an integrated circuit comprising:

a cracked layer of glass deposited over a first metalization layer of said integrated circuit; and a second insulating layer deposited in the cracks of said first layer.

26. The structure of claim 25 wherein said first layer is smooth in places where it is not cracked.

27. The structure of claim 25 wherein said first layer is spun on silicon dioxide.

28. The structure of claim 25 wherein said first layer is spun on silicon dioxide, germanium dioxide and $P_2O_5$.

29. The structure of claim 28 wherein the glass is 40 to 50 mole percent silicon dioxide, 55 to 40 mole percent germanium dioxide and 1 to 5 percent $P_2O_5$.

30. The structure of claim 25 wherein said second layer is a chemical vapor deposition oxide.

31. The structure of claim 25 wherein said second layer of insulating material matches the chemical composition of the first layer.

32. The structure of claim 25 wherein said second layer of insulating material matches the etch rate of said first layer in any etchant which will etch both said first and second layers.

33. A method of forming an insulating film over a metal interconnect pattern comprising:

depositing a first glass layer over said metal interconnect pattern;

thermally treating the glass layer until it cracks;

depositing a second glass layer over said first glass layer to fill in said cracks.

34. The method of claim 33 wherein said deposition of said first layer of glass is done by spinning on a solution comprising tetraethoxysilane, a solvent and an acid, baking the solution to remove the solvent and densify the resulting glass.

35. The method of claim 33 wherein said deposition of said first layer consists of spinning on a solution of approximately 20 grams TEOS, approximately 60 grams of isopropanol, approximately 20 grams of water and approximately 0.6 grams of nitric acid.

36. The method of claim 33 wherein said deposition of said second layer of glass is by chemical vapor deposition.

37. The method of claim 33 further comprising depositing a layer of glass over said first layer of glass prior to heat treating the first layer of glass to cause cracking.

38. The method of claim 37 wherein said deposition of said layer of glass over said first layer of glass is by spinning in a solution including tetraethoxysilane, a solvent and an acid and baking it to remove the solvent and densify the glass.

39. The method of claim 3 wherein said mixing step includes the step of mixing a sufficient amount of any compatible mineral acid except hydrofluoric acid or any organic acid to raise the solution pH to a value between 1.5 and 2.0 and wherein the second insulating layer has approximately the same coefficient of thermal expansion as does said first layer.

40. The method of claim 3 wherein said mixing step includes the step of mixing a solvent which is any of the lower alcohols or any of the lower ketones or mixture thereof or any polar solvent which will dissolve tetraethoxysilane and wherein the second insulating layer has approximately the same coefficient of thermal expansion as does said first layer.

41. The method of claim 3 wherein said mixing step includes the step of mixing a solvent which is any of the lower alcohols or any of the lower ketones or mixture thereof or any polar solvent which will dissolve tetraethoxysilane and wherein the second insulating layer has approximately the same coefficient of thermal expansion as does said first layer.

42. The method of claim 4 wherein said mixing step includes the step of mixing a sufficient amount of any compatible mineral acid except hydrofluoric acid or any organic acid to raise the solution pH to a value between 1.5 and 2.0 and wherein the second insulating layer has approximately the same coefficient of thermal expansion as does said first layer.

43. The method of claim 4 wherein said mixing step includes the step of mixing a solvent which is any of the lower alcohols or any of the lower ketones or mixture thereof or any polar solvent which will dissolve tetraethoxysilane and wherein the second insulating layer has approximately the same coefficient of thermal expansion as does said first layer.

44. The method of claim 43 wherein said mixing step includes the step of mixing a solvent which is any of the lower alcohols or any of the lower ketones or mixture thereof or any polar solvent which will dissolve tetraethoxysilane and wherein the second insulating layer has approximately the same coefficient of thermal expansion as does said first layer.

* * * * *